(12) United States Patent
Fujinami et al.

(10) Patent No.: US 10,020,342 B2
(45) Date of Patent: Jul. 10, 2018

(54) IMAGE PICKUP MODULE MANUFACTURING METHOD, AND IMAGE PICKUP MODULE MANUFACTURING DEVICE

(71) Applicant: FUJIFILM Corporation, Tokyo (JP)

(72) Inventors: Tatsuya Fujinami, Saitama (JP); Takashi Mitsuyasu, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 35 days.

(21) Appl. No.: 14/989,948

(22) Filed: Jan. 7, 2016

(65) Prior Publication Data

US 2016/0118435 A1    Apr. 28, 2016

Related U.S. Application Data

(63) Continuation of application No. PCT/JP2014/065654, filed on Jun. 12, 2014.

(30) Foreign Application Priority Data

Jul. 29, 2013    (JP) ................. 2013-156823

(51) Int. Cl.
*H04N 5/232* (2006.01)
*H01L 27/146* (2006.01)
(Continued)

(52) U.S. Cl.
CPC .......... *H01L 27/14685* (2013.01); *G02B 7/02* (2013.01); *H01L 27/14625* (2013.01); *H04N 5/2257* (2013.01); *H04N 17/002* (2013.01)

(58) Field of Classification Search
CPC ............... G02B 7/02; H01L 27/14625; H01L 27/14685; H04N 17/002; H04N 5/2257; G06T 7/0018
See application file for complete search history.

(56) References Cited

U.S. PATENT DOCUMENTS

2008/0309772 A1* 12/2008 Ikeda ................. G03B 5/00
    348/208.7
2009/0160998 A1*  6/2009 Fukamachi ........... G02B 7/021
    348/340
(Continued)

FOREIGN PATENT DOCUMENTS

JP    2009-003152 A    1/2009
JP    2010-021985 A    1/2010
(Continued)

OTHER PUBLICATIONS

International Search Report issued in PCT/JP2014/065654 dated Jul. 8, 2014.
(Continued)

*Primary Examiner* — Twyler Haskins
*Assistant Examiner* — Carramah J Quiett
(74) *Attorney, Agent, or Firm* — Birch, Stewart, Kolasch & Birch, LLP

(57) ABSTRACT

A manufacturing device holds a lens unit on a Z axis that is orthogonal to a chart surface of a measurement chart, holds an image pickup element unit on the Z axis, picks up an image of the measurement chart by an image pickup element while changing a Z-axis direction position of the image pickup element unit held on the Z axis in a state in which current is applied to a second lens drive unit and a third lens drive unit of the lens unit held on the Z axis, adjusts the position and a tilt of the image pickup element unit relative to the lens unit on the basis of image pickup signals that are obtained in the case where the image of the measurement chart is picked up, and fixes the image pickup element unit to the lens unit.

19 Claims, 9 Drawing Sheets

(51) Int. Cl.
*G02B 7/02* (2006.01)
*H04N 5/225* (2006.01)
*H04N 17/00* (2006.01)

(56) References Cited

U.S. PATENT DOCUMENTS

2009/0180021 A1* 7/2009 Kikuchi .............. H04N 5/2253
　　　　　　　　　　　　　　　　　　　　　　　348/349
2015/0049209 A1* 2/2015 Hwang ............. H04N 5/23287
　　　　　　　　　　　　　　　　　　　　　　348/208.11

FOREIGN PATENT DOCUMENTS

JP　　2012-037549 A　　2/2012
JP　　2013-097375 A　　5/2013

OTHER PUBLICATIONS

Written Opinion of the International Searching Authority issued in PCT/JP2014/065654 dated Jul. 8, 2014 (PCT/ISA/237).
English translation of the International Search Report issued in PCT/JP2014/065654 dated Jul. 8, 2014 (Form PCT/ISA/210).
English translation of Written Opinion of the International Search Authority issued in PCT/JP2014/065654 dated Jul. 8, 2014 (PCT/ISA/237).

* cited by examiner

IMAGE PICKUP MODULE MANUFACTURING METHOD, AND IMAGE PICKUP MODULE MANUFACTURING DEVICE

CROSS-REFERENCE TO RELATED APPLICATIONS

This application is a Continuation of PCT International Application No. PCT/JP2014/065654 filed on Jun. 12, 2014, which claims priority under 35 U.S.C § 119 (a) to Japanese Patent Application No. 2013-156823 filed on Jul. 29, 2013. Each of the above application(s) is hereby expressly incorporated by reference, in its entirety, into the present application.

BACKGROUND OF THE INVENTION

1. Field of the Invention

The present invention relates to an image pickup module manufacturing method and an image pickup module manufacturing device.

2. Description of the Related Art

A small and thin image pickup module is mounted on a portable electronic device such as a mobile phone having an imaging function. The image pickup module has a structure in which a lens unit in which an imaging lens is assembled is integrated with an image pickup element unit in which an image pickup element, such as a CCD image sensor or a CMOS image sensor, is assembled.

As the image pickup module, there are an image pickup module that includes an auto-focus (AF) mechanism for adjusting the focus by moving a lens of a lens unit, and an image pickup module that includes an optical image blur correction mechanism correction mechanism for optically correcting the blurring of an image to be picked up by moving a lens unit and an image pickup element unit relative to each other in a direction orthogonal to an optical axis.

For example, JP2010-21985A and JP2009-3152A disclose image pickup modules including AF mechanisms, and JP2013-97375A and JP2012-37549A disclose image pickup modules that include AF mechanisms and optical image blur correction mechanism correction mechanisms.

In recent years, an image pickup element, which has a large number of pixels equal to or larger than 3 to 10 million, has been widely used in an image pickup module, instead of an image pickup element that has a small number of pixels of about 1 to 2 million.

In the case where an image pickup element having a small number of pixels is used, particularly high accuracy is not required for the alignment between a lens unit and an image pickup element unit. However, in the case where an image pickup element having a large number of pixels is used, alignment with high accuracy is needed.

JP2010-21985A discloses a technique that automatically aligns a lens unit with an image pickup element unit and automatically fixes the image pickup element unit to the lens unit.

In this technique, an image of a measurement chart is picked up by the image pickup element while the image pickup element unit is moved in a direction of an optical axis after the lens unit and the image pickup element unit are set to initial positions; and the positions of the lens unit and the image pickup element unit are adjusted from the obtained image. After the positions of the lens unit and the image pickup element unit are adjusted, the lens unit and the image pickup element unit are fixed to each other by adhesion.

SUMMARY OF THE INVENTION

An image pickup element unit and a lens unit are movable in, for example, three directions orthogonal to each other in an image pickup module that includes an AF mechanism and an optical image blur correction mechanism. For this reason, in a step of adjusting the positions of the lens unit and the image pickup element unit, a lens of the lens unit is moved in the direction of gravity due to the influence of gravity.

In the case where the lens unit and the image pickup element unit are aligned with each other in a state in which the lens is moved due to the gravity, the lens unit and the image pickup element unit are aligned with each other in a state different from an actual use state. For this reason, there is a possibility that the quality of an image to be picked up may deteriorate.

The invention has been made in consideration of the above-mentioned circumstances, and an object of the invention is to provide an image pickup module manufacturing method and an image pickup module manufacturing device that can pick up a high-quality image by simply and accurately aligning an image pickup element unit with a lens unit even though the image pickup element unit and the lens unit are to be aligned with each other when a lens is moved due to gravity.

According to the invention, there is provided a method of manufacturing an image pickup module including a lens unit that includes a lens group and an image pickup element unit that is fixed to the lens unit and includes an image pickup element for picking up an image of a subject through the lens group. The lens unit includes a first lens drive unit that moves at least a part of lenses of the lens group in a first direction extending along an optical axis of the lens group and second and third lens drive units that move at least a part of lenses of the lens group in second and third directions, which are orthogonal to the optical axis of the lens group, respectively; and the image pickup element unit includes an electrical connection portion that is electrically connected to the image pickup element. The method includes: a first step of holding the lens unit on an axis orthogonal to a measurement chart so that the second and third directions are perpendicular to the direction of gravity, and holding the image pickup element unit on the axis; a second step of changing relative positions of the lens unit and the image pickup element unit, which are held on the axis, and the measurement chart in a direction of the axis, and driving the image pickup element through the electrical connection portion to pick up an image of the measurement chart at each relative position by the image pickup element; and a third step of adjusting at least the relative positions of the lens unit and the image pickup element unit in the direction of the axis on the basis of image pickup signals, which are obtained in the case where the image of the measurement chart is picked up by the image pickup element, and fixing the image pickup element unit to the lens unit.

According to the invention, there is provided a device for manufacturing an image pickup module including a lens unit that includes a lens group and an image pickup element unit that is fixed to the lens unit and includes an image pickup element for picking up an image of a subject through the lens group. The lens unit includes a first lens drive unit that moves at least a part of lenses of the lens group in a direction extending along an optical axis of the lens group and second and third lens drive units that move at least a part of lenses of the lens group in second and third directions, which are orthogonal to the optical axis of the lens group, respectively; and the image pickup element unit includes an electrical connection portion that is electrically connected to the image pickup element. The device includes: a measurement chart; an image pickup element unit holder that holds the image pickup element unit on an axis orthogonal to the measurement chart; a lens unit holder that is disposed between the measurement chart and the image pickup element unit holder on the axis and holds the lens unit so that the second and third directions are perpendicular to the direction of gravity; a control unit that changes relative positions of the lens unit holder, the image pickup element unit holder, and the measurement chart in a direction of the axis, and drives the image pickup element through the electrical connection portion of the image pickup element unit to allow the image pickup element to pick up an image of the measurement chart at each relative position; an adjustment unit that adjusts at least the relative positions of the lens unit and the image pickup element unit in the direction of the axis on the basis of image pickup signals that are obtained in the case where the image of the measurement chart is picked up by the image pickup element; and a unit fixing section that fixes the image pickup element unit and the lens unit of which at least the relative positions in the direction of the axis have been adjusted by the adjustment unit.

It is possible to provide an image pickup module manufacturing method and an image pickup module manufacturing device that can pick up a high-quality image by simply and accurately aligning an image pickup element unit with a lens unit even though the image pickup element unit and the lens unit are to be aligned with each other when a lens is moved due to gravity.

DESCRIPTION OF THE PREFERRED EMBODIMENTS

An embodiment of the invention will be described below with reference to the drawings.

Figure 1:
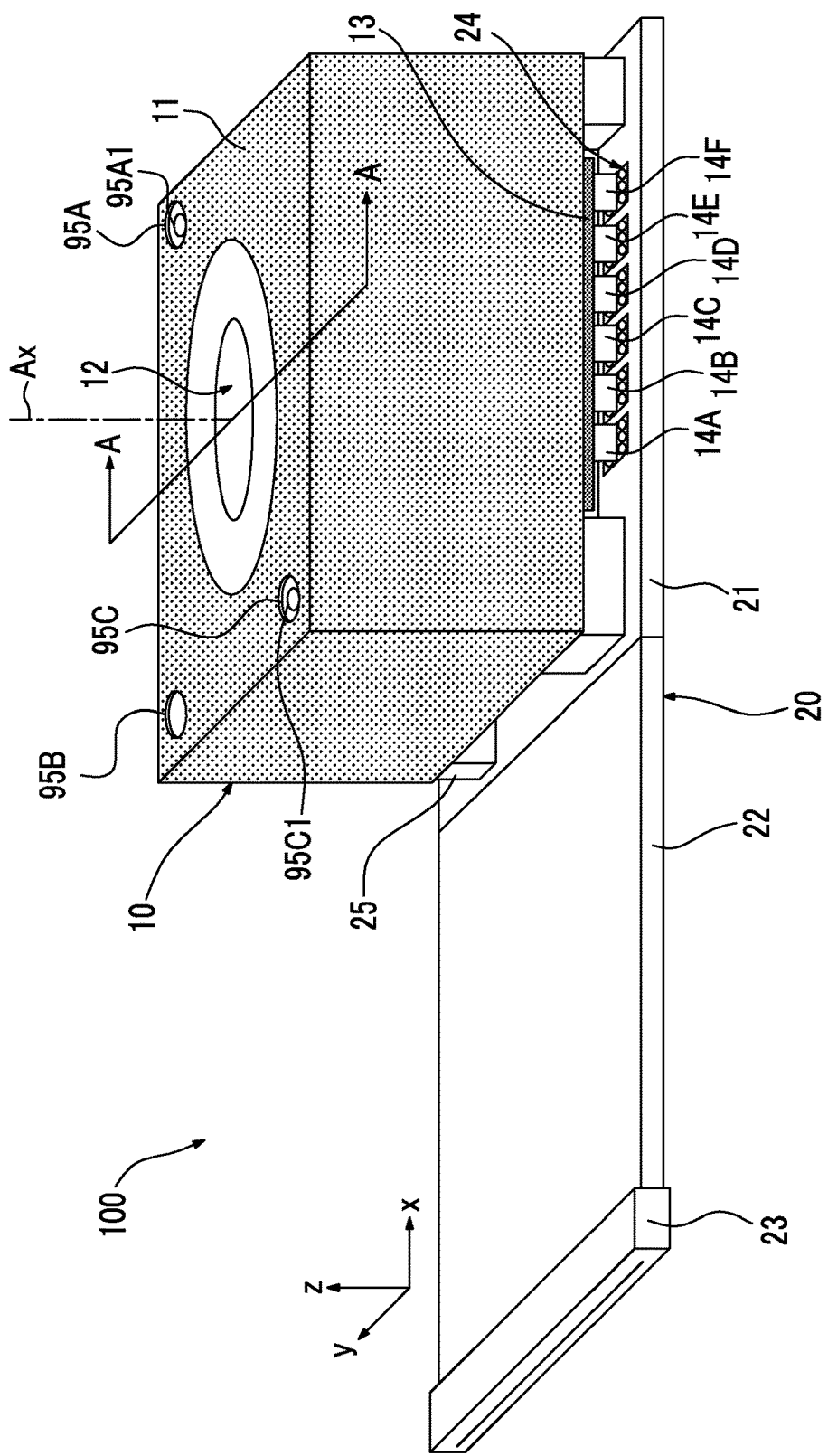
FIG. 1 is a perspective view of the appearance of an image pickup module 100.

FIG. 1 is a perspective view of the appearance of an image pickup module 100.

The image pickup module 100 includes a lens unit 10 that includes a lens group 12 and an image pickup element unit 20 that is fixed to the lens unit 10 and includes an image pickup element (not shown in FIG. 1) for picking up an image of a subject through the lens group 12.

In FIG. 1, a direction extending along an optical axis Ax of the lens group 12 is defined as a z direction and two directions, which are orthogonal to the z-axis direction and are orthogonal to each other, are defined as an x-axis direction and a y-axis direction.

The lens unit 10 includes a housing 11 that houses components to be described. A part of a flexible board 13, which is housed in the housing 11, is exposed to the outside of the housing 11. A lens unit-terminal portion, which includes terminals 14A to 14F, is connected to an end of an exposed portion of the flexible board 13.

Meanwhile, the lens unit-terminal portion also includes other terminals in addition to the terminals 14A to 14F as described below, but only the terminals 14A to 14F are shown and the other terminals are not shown in FIG. 1 for simplification.

An opening is formed at the top plate of the housing 11, and the lens group 12 is exposed to the outside through the opening. The image pickup module 100 takes light from a subject into the lens group 12 through the opening to pick up an image.

Further, positioning recesses 95A, 95B, and 95C, which hold the lens unit 10 on a manufacturing device during the manufacture of the image pickup module 100, are formed on the top plate of the housing 11. Recesses 95A1 and 95C1, which are smaller than the recesses 95A and 95C, are formed on the bottoms of the recesses 95A and 95C that are disposed on the diagonal of the top plate, respectively.

Figure 2:
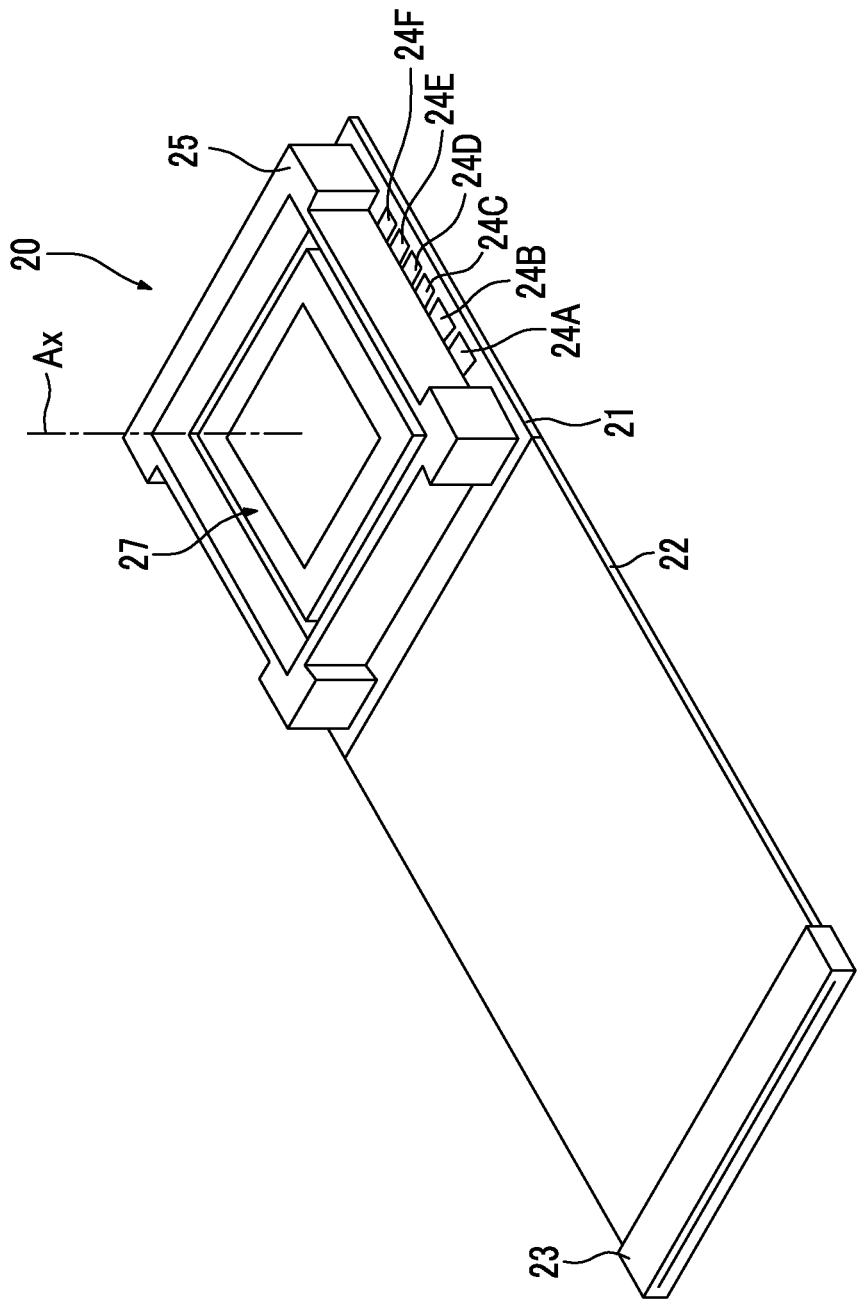
FIG. 2 is a perspective view of the appearance of an image pickup element unit 20 of the image pickup module 100 shown in FIG. 1 from which a lens unit 10 is omitted.

FIG. 2 is a perspective view of the appearance of the image pickup module 100 shown in FIG. 1 from which the lens unit 10 is omitted.

As shown in FIG. 2, the image pickup element unit 20 includes: a board 21 on which an image pickup element 27, such as a CCD (Charge Coupled Device) image sensor or a CMOS (Complementary Metal-Oxide Semiconductor) image sensor, is disposed; and a flexible board 22 that is electrically connected to the board 21.

The shape of the outer edge of the image pickup element 27 is a rectangular shape (which is a substantially rectangular shape without being limited to a complete rectangular shape). In the plan view of the image pickup module 100 that is viewed from a subject, two parallel sides among four main sides, which form the outer edge of the image pickup element 27, are parallel to the x-axis direction and the other two sides are parallel to the y-axis direction.

The pixel pitch of the image pickup element 27 is not particularly limited, but an image pickup element having a pixel pitch of 1 μm or less is used as the image pickup element 27. Here, the pixel pitch means the shortest distance among the distances between the centers of photoelectric conversion regions that are included in the pixels of the image pickup element 27.

In recent years, the pixel pitch of the image pickup element has been reduced with an increase in the number of pixels. When the pixel pitch is reduced, the area per pixel is reduced. For this reason, since the radius of the permissible circle of confusion is reduced, the depth of focus becomes shallow. In addition, since the amount of light condensed per pixel needs to be increased, the F-number of a lens tends to be reduced.

For this reason, since an image pickup module of recent years has a very shallow depth of focus, the image pickup module of recent years requires the high alignment accuracy of a lens unit and an image pickup element unit. When the pixel pitch is 1 μm or less, particularly high alignment accuracy is required.

A cylindrical cover holder 25 is formed on the board 21, and the image pickup element 27 is disposed in the cover holder 25. A sheet of cover glass (not shown) is fitted to the hollow portion of the cover holder 25 so as to be disposed above the image pickup element 27.

An image pickup element unit-terminal portion, which includes the terminals 24A to 24F for electrical connection with the lens unit 10, is provided on the surface of the board 21 outside the cover holder 25. Only a part of the terminals of the image pickup element unit-terminal portion are shown as in the case of the lens unit-terminal portion.

Wires for the image pickup element, which are connected to a data output terminal, a drive terminal, and the like of the image pickup element 27, are provided on the board 21. The wires for the image pickup element are connected to an external connection-terminal portion 23, which is provided at an end of the flexible board 22, through wires that are provided on the flexible board 22. The external connection-terminal portion 23 functions as an electrical connection portion that is electrically connected to the image pickup element 27.

Further, wires for the lens unit, which are connected to the respective terminals included in the image pickup element unit-terminal portion, are provided on the board 21. The wires for the lens unit are connected to the external connection-terminal portion 23, which is provided at the end of the flexible board 22, through the wires provided on the flexible board 22.

When the lens unit 10 and the image pickup element unit 20 are fixed to each other as shown in FIG. 1, the respective terminals of the lens unit-terminal portion 14 are electrically connected to the respective terminals of the image pickup element unit-terminal portion corresponding thereto.

In FIG. 1, the terminal 14A and the terminal 24A are electrically connected to each other, the terminal 14B and the terminal 24B are electrically connected to each other, the terminal 14C and the terminal 24C are electrically connected to each other, the terminal 14D and the terminal 24D are electrically connected to each other, the terminal 14E and the terminal 24E are electrically connected to each other, and the terminal 14F and the terminal 24F are electrically connected to each other.

Figure 3:
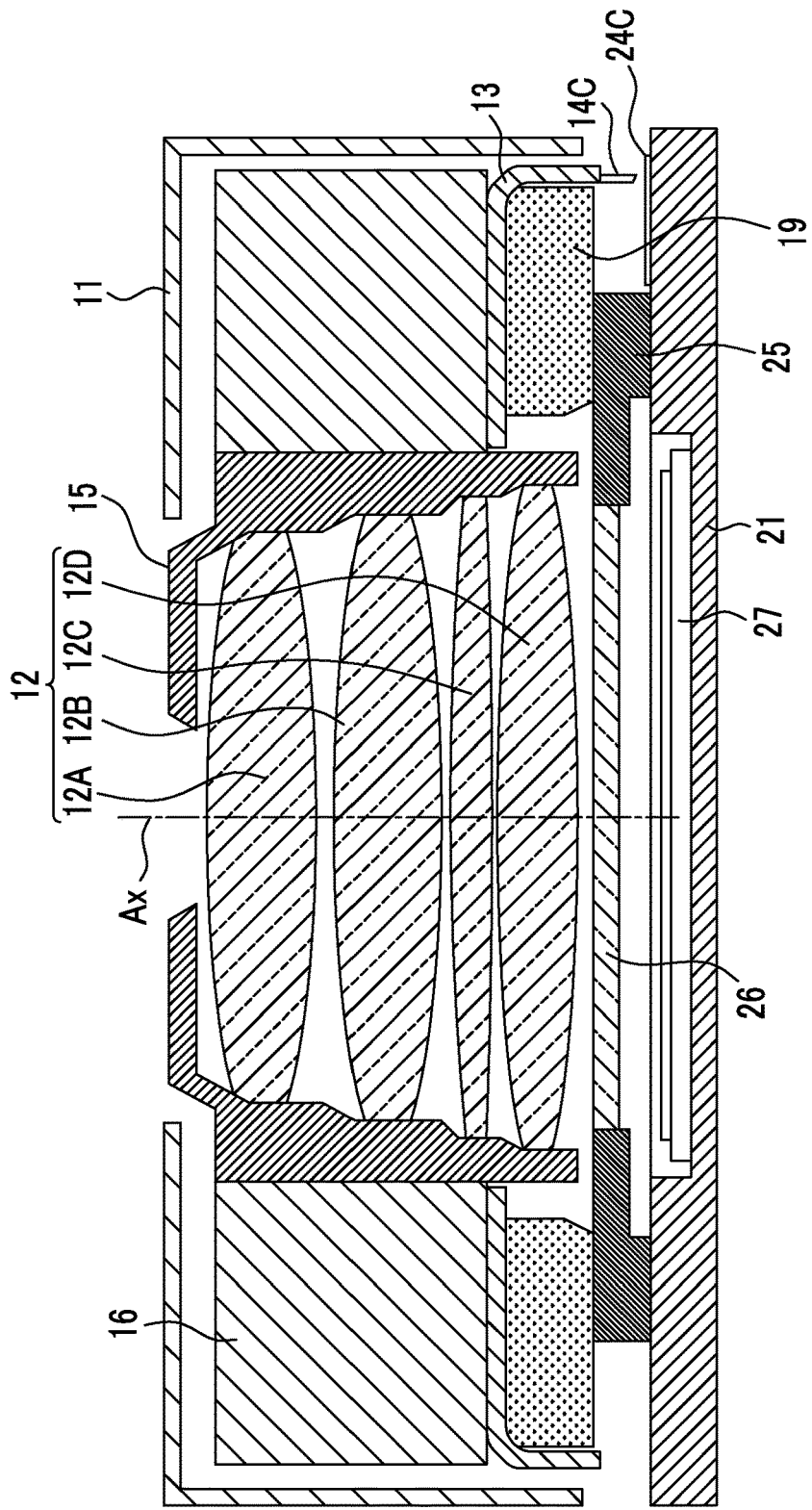
FIG. 3 is a cross-sectional view of the image pickup module 100 taken along line A-A shown in FIG. 1.

FIG. 3 is a cross-sectional view of the image pickup module 100 taken along line A-A shown in FIG. 1.

As shown in FIG. 3, the image pickup element 27 is disposed in a recess formed on the board 21, and is sealed by the cover holder 25 provided on the board 21 and the cover glass 26 fitted to the cover holder 25.

Further, as shown in FIG. 3, the lens unit 10 includes the lens group 12 that includes a plurality of (four in an example of FIG. 3) lenses (12A to 12D) disposed above the cover glass 26 and a cylindrical lens barrel 15 that supports the lens group 12. Furthermore, the lens unit 10 includes a bottom block 19 that is disposed on the upper surface of the cover holder 25 of the image pickup element unit 20 and the flexible board 13 that is fixed to the bottom block 19. In addition, the lens unit 10 includes the lens unit-terminal portion (only the terminal 14C is shown since the cross-section is shown in FIG. 3) that is connected to the flexible board 13 and a lens drive device 16 that is formed on the flexible board 13.

The lens group 12, the lens barrel 15, the bottom block 19, the flexible board 13, and the lens drive device 16 are housed in the housing 11.

The lens drive device 16 includes a first lens drive unit, a second lens drive unit, a third lens drive unit, and a hall element as a position detecting element that detects the position of a lens.

The first lens drive unit is a drive unit that moves at least a part of the lenses of the lens group 12 (all the lenses of the lens group 12 in the example of FIG. 3) in a first direction (the z-axis direction of FIG. 1) extending along the optical axis Ax of the lens group 12 to adjust the focus.

The second lens drive unit and the third lens drive unit are drive units that move at least a part of the lenses of the lens group 12 (all the lenses of the lens group 12 in the example of FIG. 3) in a second direction (the x-axis direction of FIG. 1) and a third direction (the y-axis direction of FIG. 1) orthogonal to the optical axis Ax of the lens group 12 to correct the blurring of an image that is picked up by the image pickup element 27.

Each of the first to third lens drive units is an actuator that moves the lens. A voice coil motor (VCM) is used as the lens drive unit in this embodiment, but other well-known other may be employed.

Figure 4:
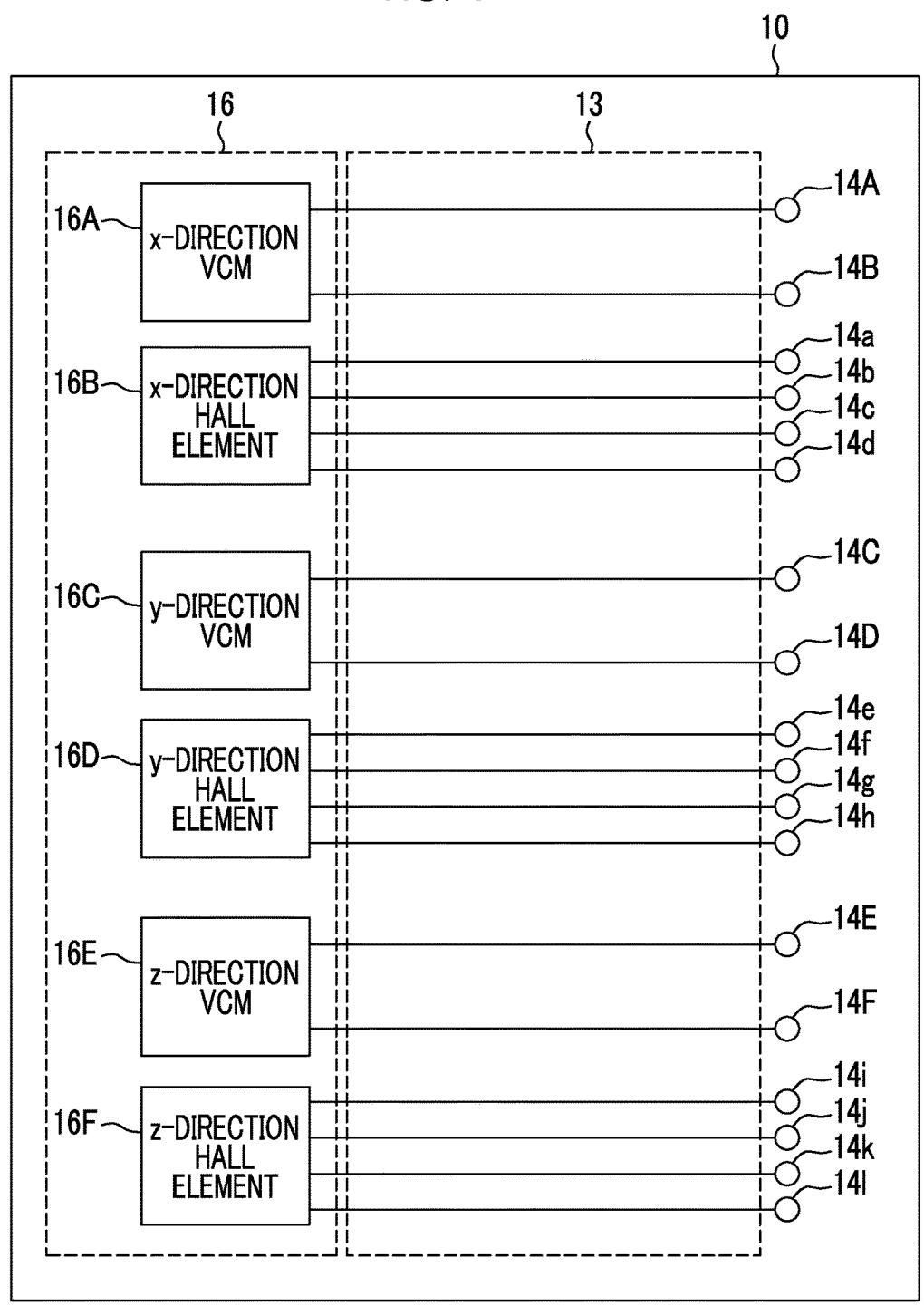
FIG. 4 is a diagram showing the electrical connection configuration of the lens unit 10 shown in FIG. 1.

FIG. 4 is a block diagram showing the electrical connection configuration of the lens unit 10 shown in FIG. 1.

As shown in FIG. 4, the lens drive device 16 includes an x-direction VCM 16A (the second lens drive unit) that moves the lens group 12 in the x-axis direction and an x-direction hall element 16B that detects the x-direction position of the lens group 12. Further, the lens drive device 16 includes a y-direction VCM 16C (the third lens drive unit) that moves the lens group 12 in the y-axis direction and a y-direction hall element 16D that detects the y-direction position of the lens group 12. Furthermore, the lens drive device 16 includes a z-direction VCM 16E (the first lens drive unit) that moves the lens group 12 in the z-axis direction and a z-direction hall element 16F that detects the z-direction position of the lens group 12.

The x-direction VCM 16A is provided with two terminals, and the two terminals are electrically connected to the terminal 14A and the terminal 14B through wires formed on the flexible board 13, respectively.

The x-direction hall element 16B is provided with four terminals, and the four terminals are electrically connected to the terminal 14a, the terminal 14b, the terminal 14c, and the terminal 14d through the wires formed on the flexible board 13, respectively.

The y-direction VCM 16C is provided with two terminals, and the two terminals are electrically connected to the terminal 14C and the terminal 14D through the wires formed on the flexible board 13, respectively.

The y-direction hall element 16D is provided with four terminals, and the four terminals are electrically connected to the terminal 14e, the terminal 14f, the terminal 14g, and the terminal 14h through the wires formed on the flexible board 13, respectively.

The z-direction VCM 16E is provided with two terminals, and the two terminals are electrically connected to the terminal 14E and the terminal 14F through the wires formed on the flexible board 13, respectively.

The z-direction hall element 16F is provided with four terminals, and the four terminals are electrically connected to the terminal 14i, the terminal 14j, the terminal 14k, and the terminal 14l through the wires formed on the flexible board 13, respectively.

Meanwhile, the number of terminals, which are necessary for each lens drive unit and each hall element, is exemplary, and is not limited to the above-mentioned number.

First, the lens unit 10 and the image pickup element unit 20 are separately manufactured in the steps of manufacturing the image pickup module 100 having the above-mentioned configuration. Further, the lens unit 10 and the image pickup element unit 20 are fixed to each other by adhesion after an adjustment step of aligning the lens unit 10 and the image pickup element unit 20 so that the image-formation plane of a subject of which the image is formed by the lens group 12 corresponds to the image pickup face of the image pickup element 27.

In the adjustment step, the alignment of the lens unit 10 and the image pickup element unit 20 is performed by moving the image pickup element unit 20 while the lens unit 10 is held in a predetermined posture by the manufacturing device. In this case, the lens unit 10 is held in a posture where the z-axis direction shown in FIG. 1 is parallel to the direction of gravity and the x-axis direction and the y-axis direction are perpendicular to the direction of gravity.

Here, the posture of the lens unit 10 where the x-axis direction and the y-axis direction are perpendicular to the direction of gravity may have to only be a posture where the lens group 12 is not moved in the x-axis direction and the y-axis direction under the influence of gravity, and the x-axis direction and the y-axis direction do not need to be exactly perpendicular to the direction of gravity. For example, as long as the lens group 12 is not displaced in the x-axis direction and the y-axis direction, the tilt of the lens unit 10 caused by a mechanical loss, frictional resistance, or the like is allowed.

In the image pickup module 100, the lens group 12 can be moved in the z-axis direction by the first lens drive unit (the z-direction VCM 16E). Accordingly, since the z-direction position of the lens group 12 is affected by gravity when the lens unit 10 is held in a posture where the z-axis direction is parallel to the direction of gravity, it is assumed that the z-direction position of the lens group 12 deviates from a reference position for alignment.

When the image pickup module 100 is used while being mounted on an electronic device (for example, a digital camera, a mobile phone, or the like), it is ideal that the initial x-direction position and the initial y-direction position of the lens group 12 are positions where the optical axis Ax corresponds to the center of the image pickup face of the image pickup element 27. Meanwhile, the initial z-direction position of the lens group 12 may be any position.

Since the x-direction position and the y-direction position of the lens group 12 are not affected by gravity when the lens unit 10 is held in a posture where the z-axis direction is parallel to the direction of gravity, the x-direction position and the y-direction position of the held lens group 12 can be made to correspond to the initial positions at the time of use. Further, the z-direction position of the lens group 12 is affected by gravity, but there is no problem even though the z-direction position of the held lens group 12 is different from the initial z-direction position of the lens group 12 at the time of use.

Accordingly, when the alignment of the lens unit 10 and the image pickup element unit 20 is performed by moving the image pickup element unit 20 while the lens unit 10 is held in a posture where the z-axis direction is parallel to the direction of gravity, highly accurate alignment can be performed even though the first lens drive unit, the second lens drive unit, and the third lens drive unit are not driven.

Meanwhile, the lens unit 10 may be designed so that the z-direction position of the lens group 12 corresponds to the end of infinity or the closest end when current is not applied to the first lens drive unit (the z-direction VCM 16E) while the lens unit 10 is held in a posture where the z-axis direction is parallel to the direction of gravity. Accordingly, the alignment of the lens unit 10 and the image pickup element unit 20 is more easily performed.

Further, there is a possibility that the x-direction position and the y-direction position of the lens group 12 may slightly deviate from the initial positions at the time of use due to an assembly error, or the like even though the lens unit 10 is held in a posture where the z-axis direction is parallel to the direction of gravity.

Accordingly, in the adjustment step, the alignment of the lens unit 10 and the image pickup element unit 20 may be performed after current is applied to the second lens drive unit (the x-direction VCM 16A) and the third lens drive unit (the y-direction VCM 16C) and the second lens drive unit and the third lens drive unit are driven to hold the lens group 12 at the initial positions. Accordingly, more highly accurate alignment can be performed.

A manufacturing device for the image pickup module 100 will be described below. A manufacturing device, which is adapted to be capable of controlling the x-direction position and the y-direction position of the lens group 12 by applying current to the second lens drive unit and the third lens drive unit, will be described below by way of example.

Figure 5:
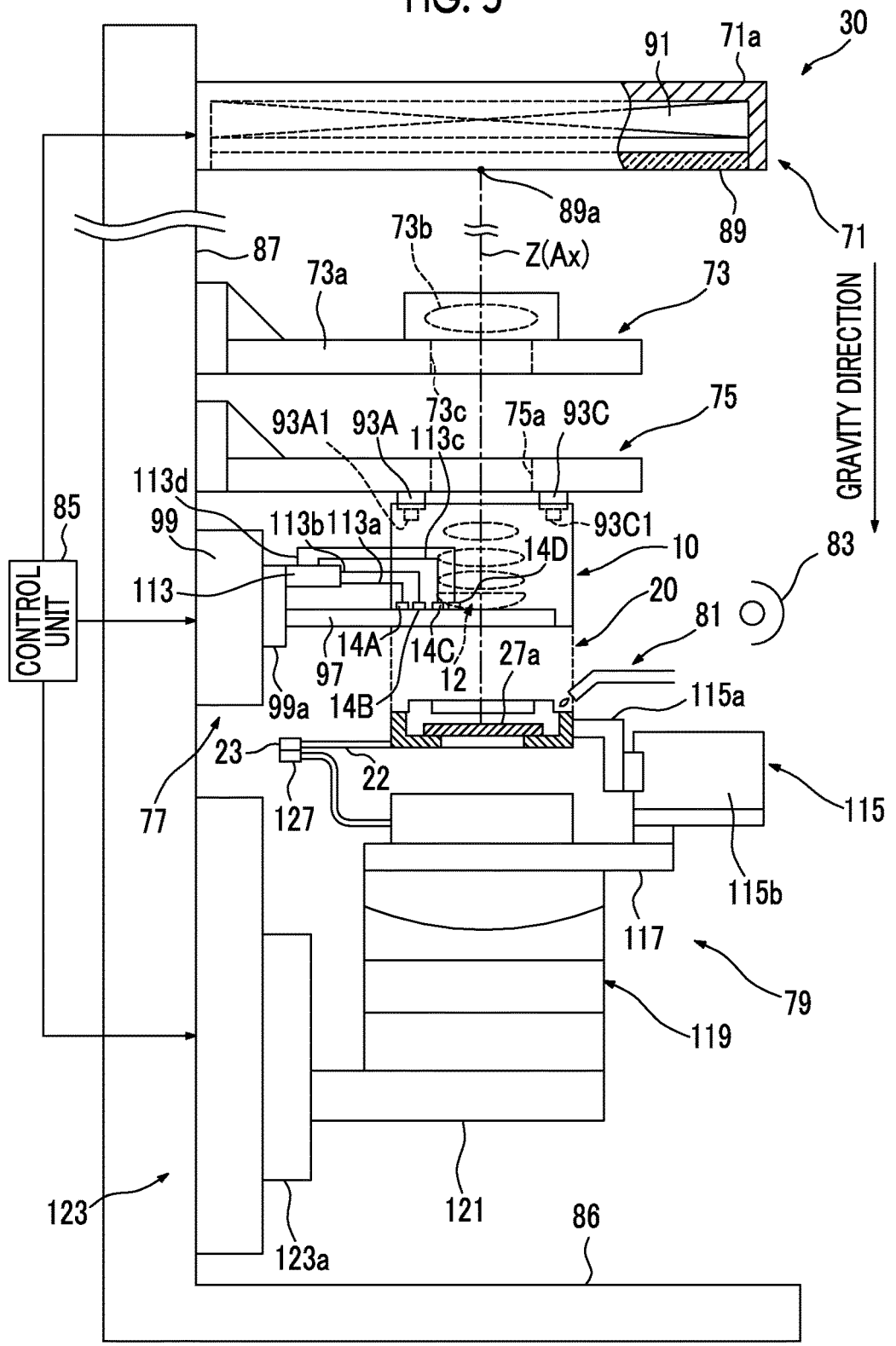
FIG. 5 is a side view showing the schematic structure of a manufacturing device 200 for the image pickup module 100.

FIG. 5 is a side view showing the schematic structure of the manufacturing device 200 for the image pickup module 100.

The image pickup module manufacturing device 200 completes the image pickup module 100 by fixing the image pickup element unit 20 to the lens unit 10 after adjusting the position and the tilt of the image pickup element unit 20 relative to the lens unit 10.

The image pickup module manufacturing device 200 includes a chart unit 71, a condensing unit 73, a lens positioning plate 75, a lens holding mechanism 77, an image pickup element unit holder 79, an adhesive supply unit 81, an ultraviolet lamp 83, and a control unit 85 that controls these. These except for the control unit 85 are fixed to the surface 87 of a common workbench 86 that is parallel to the direction of gravity.

The chart unit 71 includes a box-shaped housing 71a, a measurement chart 89 that is fitted into the housing 71a, and a light source 91 that is assembled in the housing 71a and illuminates the measurement chart 89 from the back. The measurement chart 89 is formed of, for example, a plastic plate having light diffusivity. The chart surface of the measurement chart 89 is perpendicular to the direction of gravity.

Figure 6:
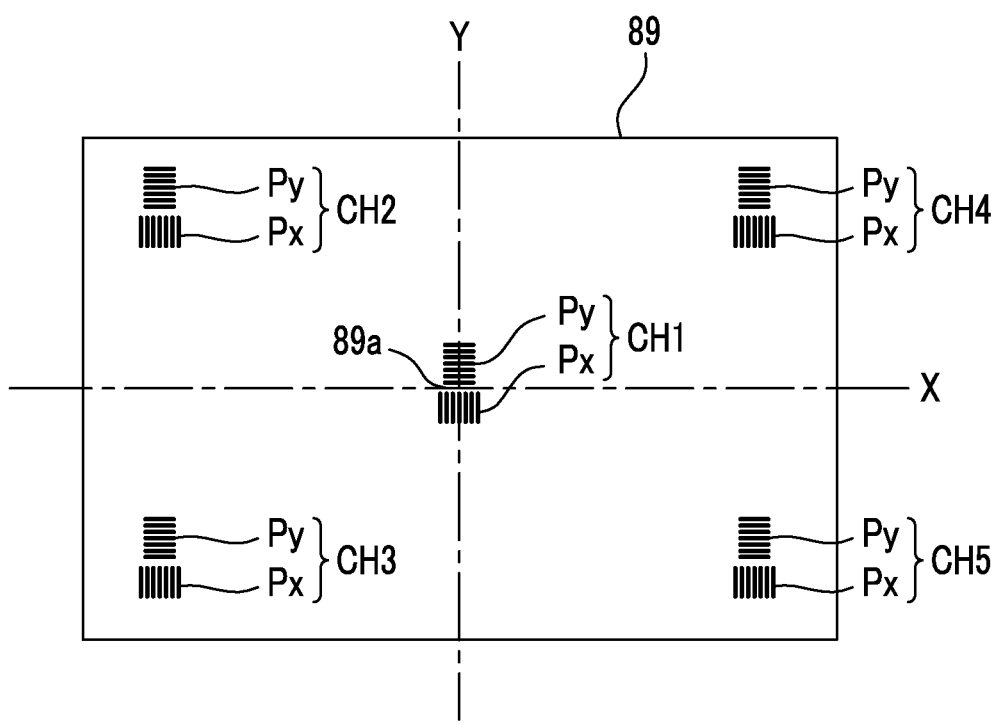
FIG. 6 is a front view of a measurement chart.

FIG. 6 is a view showing the chart surface of the measurement chart 89. The measurement chart 89 has a rectangular shape, and a plurality of chart images CH1, CH2, CH3, CH4, and CH5 are printed on the chart surface on which a chart pattern is provided.

All of the plurality of chart images are the same images, and have a so-called ladder-shaped chart pattern in which black lines are arranged at predetermined regular intervals. Each of the chart images includes a horizontal chart image Px in which the black lines are arranged in a horizontal direction of the image and a vertical chart image Py in which the black lines are arranged in a vertical direction of the image.

The condensing unit 73 is disposed on a Z axis, which is a line perpendicular to the chart surface of the measurement chart 89 and is a line passing through a center 89*a* of the chart surface, so as to face the chart unit 71.

The condensing unit 73 includes a bracket 73*a* that is fixed to the surface 87 of the workbench 86 and a condensing lens 73*b*. The condensing lens 73*b* condenses light emitted from the chart unit 71 and allows the condensed light to be incident on the lens unit 10 through an opening 73*c* that is formed in the bracket 73*a*.

The lens positioning plate 75 is made of, for example, metal so as to have stiffness, and is provided with an opening 75*a* through which light condensed by the condensing unit 73 passes. The lens positioning plate 75 is disposed on the Z axis so as to face the condensing unit 73.

Figure 7:
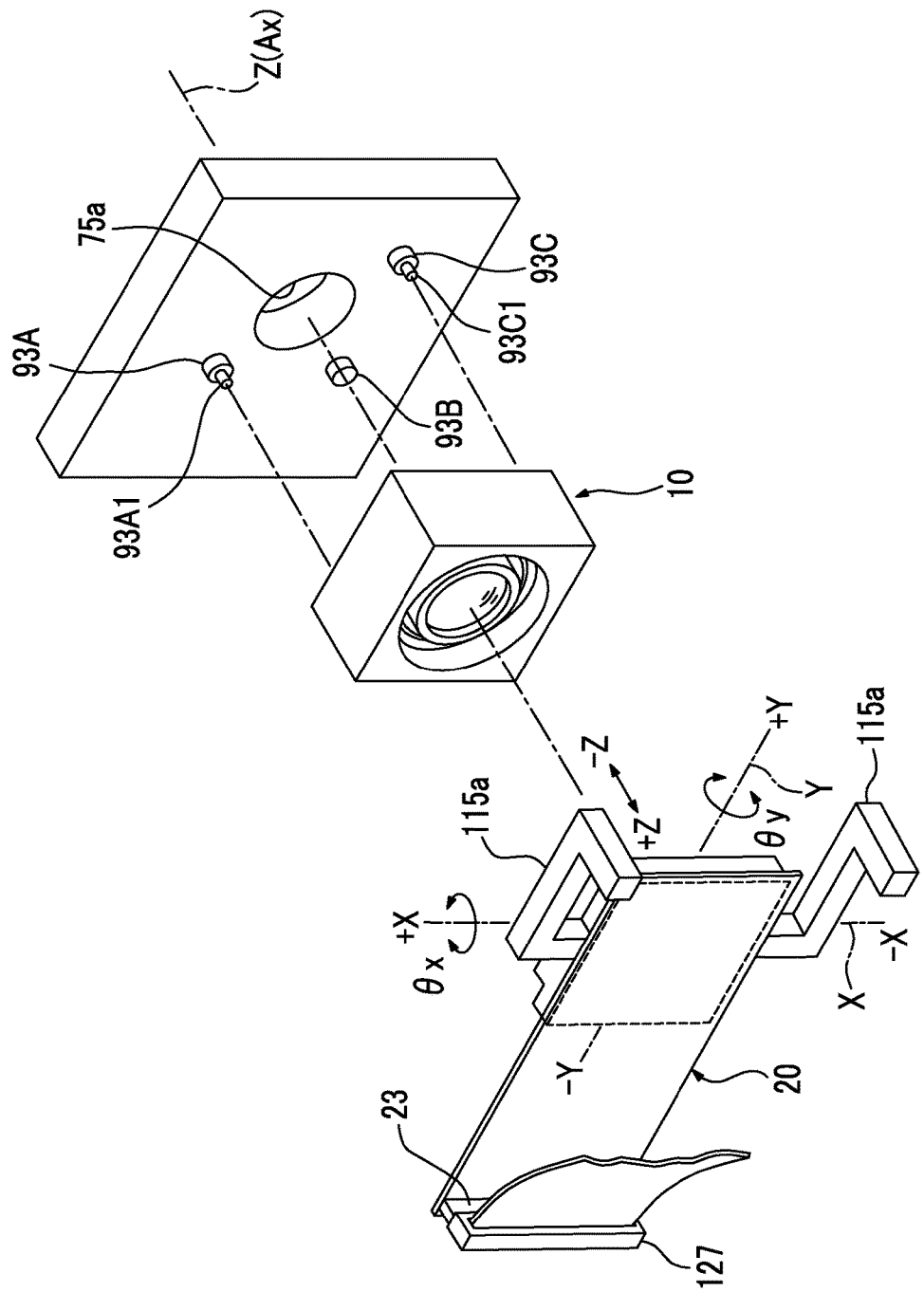
FIG. 7 is a view showing a state in which the lens unit 10 and the image pickup element unit 20 are held by the image pickup module manufacturing device 200.

FIG. 7 is a view showing a state in which the lens unit 10 and the image pickup element unit 20 are held by the image pickup module manufacturing device 200.

As shown in FIG. 7, three contact pins 93A, 93B, and 93C are provided around the opening 75*a* on the surface of the lens positioning plate 75 facing the lens holding mechanism 77.

Insertion pins 93A1 and 93C1, each of which has a diameter smaller than the diameter of the contact pin, are provided at the ends of two contact pins 93A and 93C, which are disposed on a diagonal, among the three contact pins 93A, 93B, and 93C.

The contact pins 93A, 93B, and 93C are received in the recesses 95A, 95B, and 95C of the lens unit 10 shown in FIG. 1, and the insertion pin 93A1 and 93C1 are inserted into the recesses 95C1 and 95A1 and position the lens unit 10.

When the lens unit 10 is positioned in this way, the Z axis corresponds to the optical axis Ax of the lens unit 10. That is, the x-axis direction and the y-axis direction of FIG. 1 in the lens unit 10 are perpendicular to the direction of gravity and the z-axis direction is parallel to the direction of gravity.

The lens holding mechanism 77 includes a holding plate 97 and a first slide stage 99. The holding plate 97 holds the lens unit 10 on the Z axis so that the top plate of the housing 11 faces the chart unit 71; and the first slide stage 99 moves the holding plate 97 in the Z-axis direction.

The first slide stage 99 is an electric precision stage, and moves a stage part 99*a*, which is engaged with a ball screw, in the Z-axis direction by rotating the ball screw by the driving of a motor (not shown).

When the holding plate 97 is moved in the Z-axis direction and the holding plate 97 is pressed against the bottom block 19 of the lens unit 10 positioned by the lens positioning plate 75, the lens unit 10 is held by the manufacturing device 200.

The lens positioning plate 75 and the lens holding mechanism 77 form a lens unit holder that holds the lens unit 10 on the Z axis as described above so that the x-axis direction and the y-axis direction are perpendicular to the direction of gravity.

A probe unit 113, which is provided with four probe pins 113*a*, 113*b*, 113*c*, and 113*d*, is mounted on the stage part 99*a* so as to face the holding plate 97.

The probe unit 113 drives the second lens drive unit (the x-direction VCM 16A) and the third lens drive unit (the y-direction VCM 16C) by making the probe pin 113*a* come into contact with the terminal 14A of the lens unit 10, making the probe pin 113*b* come into contact with the terminal 14B of the lens unit 10, making the probe pin 113*c* come into contact with the terminal 14C of the lens unit 10, and making the probe pin 113*d* come into contact with the terminal 14D of the lens unit 10 so that current is applied to the terminals 14A, 14B, 14C, and 14D.

The probe unit 113 functions as a current application unit that applies current to the terminals 14A to 14D to drive the second lens drive unit and the third lens drive unit on the basis of a command of the control unit 85.

The probe unit 113 adjusts the position of the lens group 12 of the lens unit 10 by driving the second lens drive unit and the third lens drive unit so that the x-direction position and the y-direction position of the lens group 12 of the lens unit 10 are set to the initial positions at the time of use.

The image pickup element unit holder 79 holds the image pickup element unit 20 on the Z axis. Further, the image pickup element unit holder 79 can change the Z-axis direction position and the tilt of the image pickup element unit 20 by the control of the control unit 85.

The tilt of the image pickup element unit 20 means the tilt of an image pickup face 27*a* of the image pickup element 27 relative to a plane orthogonal to the Z axis.

The image pickup element unit holder 79 includes a chuck hand 115, a two-axis rotation stage 119, and a second slide stage 123. The chuck hand 115 holds the image pickup element unit 20 on the Z axis so that the image pickup face 27*a* faces the chart unit 71. The two-axis rotation stage 119 holds a substantially crank-shaped bracket 117 on which the chuck hand 115 is mounted, and adjusts the tilt of the image pickup element unit 20 about two axes (a horizontal X axis and a vertical Y axis) orthogonal to the Z axis. The second slide stage 123 holds a bracket 121 on which the two-axis rotation stage 119 is mounted and moves the bracket 121 in the Z-axis direction. That is, the two-axis rotation stage and the second slide stage 123 form an adjustment unit that adjusts at least the Z-axis direction position of the image pickup element unit 20 relative to the lens unit 10.

As shown in FIG. 7, the chuck hand 115 includes a pair of pinching members 115*a* that are bent substantially in the shape of a crank, and an actuator 115*b* (see FIG. 5) that moves these pinching members 115*a* in the X-axis direction orthogonal to the Z axis. The pinching members 115*a* pinch the outer frame of the image pickup element unit 20, and hold the image pickup element unit 20.

Further, the chuck hand 115 positions the image pickup element unit 20 pinched by the pinching members 115*a* so that the optical axis Ax of the lens unit 10 substantially corresponds to the position of the center of the image pickup face 27*a*.

Furthermore, the chuck hand 115 positions the image pickup element unit 20 pinched by the pinching members 115*a* so that the respective terminals of the image pickup element unit-terminal portion of the image pickup element unit 20 and the respective terminals of the lens unit-terminal portion of the held lens unit 10 overlap each other when viewed in the Z-axis direction.

The two-axis rotation stage 119 is an electric two-axis goniostage, and tilts the image pickup element unit 20 in a θx direction about the X axis and in a θy direction about the Y axis orthogonal to the Z axis and the X axis by the driving of two motors (not shown) while the position of the center of the image pickup face 27*a* serves as the center of rotation. Accordingly, when the image pickup element unit 20 is tilted in the respective directions, the position of the center of the image pickup face 27*a* does not deviate from the Z axis.

The second slide stage 123 is an electric precision stage, and moves a stage part 123*a*, which is engaged with a ball screw, in the Z-axis direction by rotating the ball screw by the driving of a motor (not shown). The bracket 121 is fixed to the stage part 123*a*.

A connector cable 127, which is connected to the external connection-terminal portion 23 provided at the end of the flexible board 22 of the image pickup element unit 20, is mounted on the two-axis rotation stage 119. A driving signal is input to the image pickup element 27 through the connector cable 127, or image pickup signals output from the image pickup element 27 is output through the connector cable 127.

The adhesive supply unit 81 and the ultraviolet lamp 83 form a unit fixing section that fixes the image pickup element unit 20 to the lens unit 10.

After the adjustment of the position and the tilt of the image pickup element unit 20 relative to the lens unit 10 is ended, the adhesive supply unit 81 supplies an ultraviolet curable adhesive to a gap between the lens unit 10 and the image pickup element unit 20.

The ultraviolet lamp 83 cures the adhesive by irradiating the ultraviolet curable adhesive, which is supplied to the gap, with ultraviolet light. Meanwhile, an instant adhesive, a thermosetting adhesive, a naturally curable adhesive, and the like other than the ultraviolet curable adhesive can also be used as the adhesive.

Figure 8:
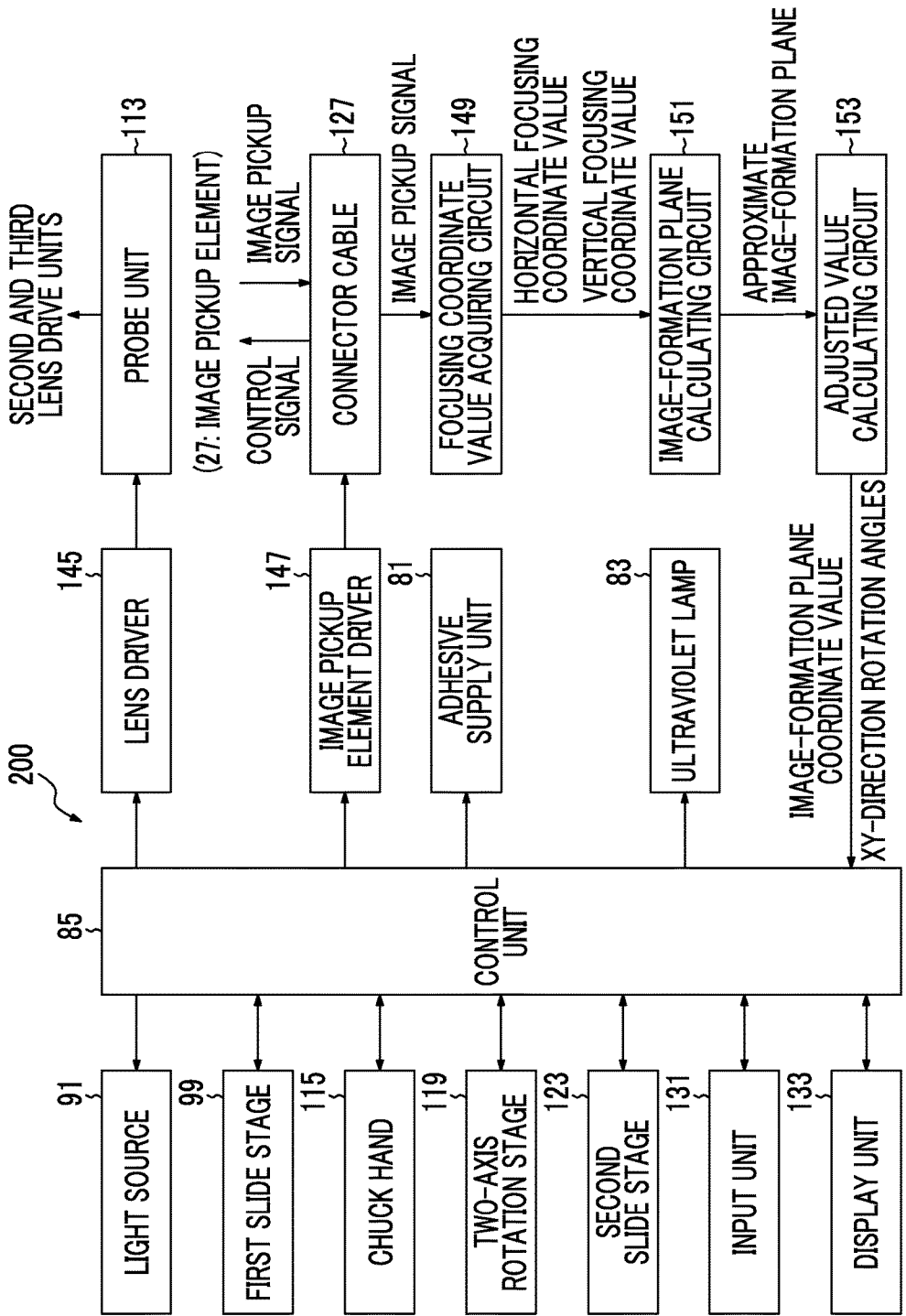
FIG. 8 is a block diagram showing the internal configuration of the image pickup module manufacturing device 200.

FIG. 8 is a block diagram showing the internal configuration of the image pickup module manufacturing device 200.

As shown in FIG. 8, the above-mentioned respective parts are connected to the control unit 85. The control unit 85 is, for example, a microcomputer including a CPU, a ROM, a RAM, and the like, and controls the respective parts on the basis of a control program stored in the ROM. Further, an input unit 131, such as a keyboard or a mouse, which is used to perform various kinds of settings and a display unit 133 in which the setting conents, the work contents, the work results, and the like are displayed are connected to the control unit 85.

A lens driver 145 is a drive circuit that drives the second lens drive unit and the third lens drive unit, and supplies driving current to the second lens drive unit and the third lens drive unit through the probe unit 113. An image pickup element driver 147 is a drive circuit that drives the image pickup element 27, and inputs a driving signal to the image pickup element 27 through the connector cable 127.

A focusing coordinate value acquiring circuit 149 acquires focusing coordinates values, which are positions having high focusing degrees in the Z-axis direction, at a plurality of image pickup positions that are set on the image pickup face 27*a* of the image pickup element 27 (positions corresponding to the respective chart images CH1, CH2, CH3, CH4, and CH5 of the measurement chart 89).

When the focusing coordinate values of the plurality of image pickup positions are to be acquired, the control unit 85 controls the second slide stage 123 and sequentially moves the image pickup element unit 20 to a plurality of measurement positions (Z0, Z1, Z2, . . . ) that are discretely set on the Z axis in advance. Further, the control unit 85 controls the image pickup element driver 147, and allows the image pickup element 27 to pick up the plurality of chart images CH1, CH2, CH3, CH4, and CH5 of the measurement chart 89 that are formed by the lens group 12 at the respective measurement positions.

The focusing coordinate value acquiring circuit 149 extracts signals of pixels corresponding to the plurality of image pickup positions from the image pickup signals, which are input through the connector cable 127, and calculates individual focusing evaluation values of the plurality of image pickup positions from the signals of the pixels. Further, a measurement position, which is obtained when a predetermined focusing evaluation value is obtained at each image pickup position, is defined as a focusing coordinate value on the Z axis.

For example, a contrast transfer function value (hereinafter, referred to as a CTF value) can be used as the focusing evaluation value. A CTF value means a value of the contrast of an image with respect to a spatial frequency, and it is regarded that a focusing degree is high when a CTF value is high.

The focusing coordinate value acquiring circuit 149 calculates CTF values in a plurality of directions that are set on an XY coordinate plane, for each of the plurality of measurement positions (Z0, Z1, Z2, . . . ), which are set on the Z axis, at each of the plurality of image pickup positions. For example, the focusing coordinate value acquiring circuit 149 calculates X-CTF values and Y-CTF values, which are CTF values in the respective directions, while a horizontal direction (X-axis direction) that is a transverse direction of the image pickup face 27*a* and a vertical direction (Y-axis direction) that is orthogonal to the horizontal direction serve as the directions in which the CTF values are calculated.

The focusing coordinate value acquiring circuit 149 acquires Z-axis coordinates (Zp1, Zp2, Zp3, Zp4, and Zp5) of the measurement positions where the X-CTF values are maximum at the plurality of image pickup positions corresponding to the respective chart images CH1, CH2, CH3, CH4, and CH5, as horizontal focusing coordinate values. Likewise, the focusing coordinate value acquiring circuit 149 acquires Z-axis coordinates of the measurement positions where the Y-CTF values are maximum, as vertical focusing coordinate values.

A horizontal focusing coordinate value and a vertical focusing coordinate value of each image pickup position are input to an image-formation plane calculating circuit 151 from the focusing coordinate value acquiring circuit 149. The image-formation plane calculating circuit 151 develops XY coordinate values of the respective image pickup positions, which are obtained when the image pickup face 27*a* corresponds to an XY coordinate plane, and a plurality of evaluation points, which are represented by combinations of Z-axis horizontal focusing coordinate values and Z-axis vertical focusing coordinate values obtained at the respective image pickup positions, on a three-dimensional coordinate system in which the XY coordinate plane and the Z axis are combined with each other; and calculates an approximate image-formation plane that is represented as one plane in the three-dimensional coordinate system on the basis of the relative positions of these evaluation points.

Information about the approximate image-formation plane is input to an adjusted value calculating circuit 153 from the image-formation plane calculating circuit 151. The adjusted value calculating circuit 153 calculates a Z-axis image-formation plane coordinate value F1 that is an intersection between the approximate image-formation plane and the Z axis, and XY-direction rotation angles that are the tilt of the approximate image-formation plane about the X axis and the tilt of the approximate image-formation plane about the Y axis relative to the XY coordinate plane; and inputs the Z-axis image-formation plane coordinate value and the XY-direction rotation angles to the control unit 85.

The control unit 85 drives the image pickup element unit holder 79 on the basis of the image-formation plane coordinate value and the XY-direction rotation angles that are input from the adjusted value calculating circuit 153; and adjusts the Z-axis direction position and the tilt of the image pickup element unit 20 so that the image pickup face 27*a* corresponds to the approximate image-formation plane.

The above-mentioned image pickup module manufacturing device 200 approximately performs the following steps.

(1) A step of holding the lens unit 10 on the Z axis orthogonal to the chart surface of the measurement chart 89 so that the x-axis direction and the y-axis direction are perpendicular to the direction of gravity; and holding the image pickup element unit 20 on the Z axis.

(2) A step of changing the Z-axis direction position of the image pickup element unit 20 held on the Z axis; and driving the image pickup element 27 through the electrical connection portion at each position, while current is applied to the second lens drive unit and the third lens drive unit of the lens unit 10 held on the Z axis, to pick up an image of the measurement chart 89 by the image pickup element 27.

(3) A step of adjusting the Z-axis direction position and the tilt of the image pickup element unit 20 relative to the lens unit 10 on the basis of image pickup signals, which are obtained when the image of the measurement chart 89 is picked up by the image pickup element 27, and fixing the image pickup element unit 20 to the lens unit 10.

Details of steps of manufacturing the image pickup module 100 by the image pickup module manufacturing device 200 will be described below with reference to a flowchart of FIG. 9.

First, the holding (S1) of the lens unit 10 using the lens holding mechanism 77 will be described. The control unit 85 forms a space, into which the lens unit 10 can be inserted, between the lens positioning plate 75 and the holding plate 97 by controlling the first slide stage 99 to move the holding plate 97 in the Z-axis direction. The lens unit 10 is held by a robot (not shown) and is transferred to the space between the lens positioning plate 75 and the holding plate 97.

The control unit 85 detects the movement of the lens unit 10 by an optical sensor or the like, and moves the stage part 99a of the first slide stage 99 in a direction where the stage part 99a approaches the lens positioning plate 75. Accordingly, the holding plate 97 holds the lens unit 10. The probe unit 113 comes into contact with the terminals 14A and 14B of the lens unit 10 to electrically connect the second lens drive unit to the lens driver 145.

After the holding of the lens unit 10 using the robot (not shown) is released, the holding plate 97 is further moved toward the lens positioning plate 75. Further, the recesses 95A, 95B, and 95C of the lens unit 10 come into contact with the contact pins 93A, 93B, and 93C, and the insertion pins 93A1 and 93C1 are inserted into the recesses 95C1 and 95A1, respectively. Accordingly, the lens unit 10 is positioned in the Z-axis direction, the X-axis direction, and the Y-axis direction.

Next, the holding (S2) of the image pickup element unit 20 using the image pickup element unit holder 79 will be described. The control unit 85 forms a space, into which the image pickup element unit 20 can be inserted, between the holding plate 97 and the two-axis rotation stage 119 by controlling the second slide stage 123 to move the two-axis rotation stage 119 in the Z-axis direction. The image pickup element unit 20 is held by a robot (not shown) and is transferred to the space between the holding plate 97 and the two-axis rotation stage 119.

The control unit 85 detects the movement of the image pickup element unit 20 by an optical sensor or the like, and moves the stage part 123a of the second slide stage 123 in a direction where the stage part 123a approaches the holding plate 97. Then, a worker holds the image pickup element unit 20 by using the pinching members 115a of the chuck hand 115. Further, the connector cable 127 is connected to the external connection-terminal portion 23 of the image pickup element unit 20. Accordingly, the image pickup element 27 and the control unit 85 are electrically connected to each other. After that, the holding of the image pickup element unit 20 using the robot (not shown) is released.

After the lens unit 10 and the image pickup element unit 20 are held on the Z axis in this way, the horizontal focusing coordinate value and the vertical focusing coordinate value of each image pickup position of the image pickup face 27a are acquired by the focusing coordinate value acquiring circuit 149 (S3).

Specifically, the control unit 85 controls the second slide stage 123 to move the two-axis rotation stage 119 in a direction where the two-axis rotation stage 119 approaches the lens holding mechanism 77, and to move the image pickup element unit 20 to an initial measurement position where the image pickup element 27 is closest to the lens unit 10.

The control unit 85 allows the light source 91 of the chart unit 71 to emit light. Further, the control unit 85 inputs driving signals from the lens driver 145 to the terminals 14A, 14B, 14C, and 14D, and drives the second lens drive unit and the third lens drive unit to hold the x-direction position and the y-direction position of the optical axis Ax of the lens group 12 at the reference positions (for example, initial positions at the time of actual use).

Next, the control unit 85 controls the image pickup element driver 147 to allow the image pickup element 27 to pick up the chart images CH1, CH2, CH3, CH4, and CH5 that are formed by the lens unit 10. The image pickup element 27 inputs image pickup signals, which are taken, to the focusing coordinate value acquiring circuit 149 through the connector cable 127.

The focusing coordinate value acquiring circuit 149 extracts signals of pixels at the image pickup positions corresponding to the respective chart images CH1, CH2, CH3, CH4, and CH5 from the input image pickup signals, and calculates X-CTF values and Y-CTF values of the respective image pickup positions from the signals of the pixels. The control unit 85 stores the information about the X-CTF values and the Y-CTF values in, for example, the RAM of the control unit 85.

The control unit 85 sequentially moves the image pickup element unit 20 to a plurality of measurement positions (Z0, Z1, Z2, . . . ) that are set in the Z-axis direction; and allows the image pickup element 27 to pick up the chart images of the measurement chart 89 at the respective measurement position while holding the x-direction position and the y-direction position of the optical axis Ax of the lens group 12 at the reference positions. The focusing coordinate value acquiring circuit 149 calculates the X-CTF values and the Y-CTF values of the respective image pickup positions at the respective measurement positions.

The focusing coordinate value acquiring circuit 149 selects the maximum values from the plurality of X-CTF values and the plurality of Y-CTF value, which are calculated, at the respective image pickup positions; and acquires the Z-axis coordinates of the measurement positions, at which the maximum values are obtained, as the horizontal focusing coordinate values and the vertical focusing coordinate values of the image pickup positions.

The horizontal focusing coordinate values and the vertical focusing coordinate values, which are acquired by the focusing coordinate value acquiring circuit 149, are input to the image-formation plane calculating circuit 151. The image-formation plane calculating circuit 151 calculates an approximate image-formation plane F, which is approximated as a plane, by, for example, a least squares method (S5).

Information about the approximate image-formation plane F, which is calculated by the image-formation plane calculating circuit 151, is input to the adjusted value calculating circuit 153. The adjusted value calculating circuit 153 calculates an image-formation plane coordinate value F1 that is an intersection between the approximate image-formation plane F and the Z axis, and XY-direction rotation angles that are the tilt of the approximate image-formation plane about the X axis and the tilt of the approximate image-formation plane about the Y axis relative to the XY coordinate plane; and inputs the image-formation plane coordinate value F1 and the XY-direction rotation angles to the control unit 85 (S6).

The control unit 85 controls the two-axis rotation stage 119 and the second slide stage 123 to move the image pickup element unit 20 in the Z-axis direction on the basis of the image-formation plane coordinate value F1 and the XY-direction rotation angles so that the position of the center of the image pickup face 27a of the image pickup element 27 corresponds to the image-formation plane coordinate value F1 and to adjust the θx-direction angle and the θy-direction angle of the image pickup element unit 20 so that the tilt of the image pickup face 27a corresponds to the approximate image-formation plane (S7).

The control unit 85 performs a confirmation step of confirming the focusing position of each image pickup position after adjusting the position of the image pickup element unit 20 (S8). In this confirmation step, the above-mentioned step S3 is performed again. After the position of the image pickup element unit 20 is adjusted, the variations of corresponding evaluation values in the horizontal direction and the vertical direction are reduced at each image pickup position.

After the confirmation step (S8) is ended (S4), the control unit 85 moves the image pickup element unit 20 in the Z-axis direction so that the position of the center of the image pickup face 27a corresponds to the image-formation plane coordinate value F1 (S9). Further, the control unit 85 supplies an ultraviolet curable adhesive to the gap between the lens unit 10 and the image pickup element unit 20 from the adhesive supply unit 81 (S10), and turns on the ultraviolet lamp 83 to cure the ultraviolet curable adhesive (S11).

After the adhesive is cured and the lens unit 10 and the image pickup element unit 20 are fixed to each other, the completed image pickup module 100 is taken out of the image pickup module manufacturing device 200 by a robot (not shown) (S13).

Meanwhile, the lens unit 10 and the image pickup element unit 20 can be fixed to each other by the ultraviolet curable adhesive, but the curing of the ultraviolet curable adhesive may be used to temporarily fix the image pickup element unit 20 to the lens unit 10.

For example, while the lens unit 10 and the image pickup element unit 20 are temporarily fixed to each other, the image pickup module 100 may be taken out of the image pickup module manufacturing device 200 and may be subjected to a desired step such as a cleaning treatment. Then, the lens unit 10 and the image pickup element unit 20 may be completely fixed to each other by a thermosetting adhesive or the like.

Since the image pickup module 100 is manufactured by the above-mentioned manufacturing device 200, the lens unit 10 and the image pickup element unit 20 can be aligned with each other with high accuracy.

Modifications of the manufacturing device 200 will be described below.

First Modification

The manufacturing device 200 shown in FIG. 5 may have a structure in which the probe unit 113 is omitted. According to this structure, current does not need to be applied to the lens unit 10 during the alignment of the lens unit 10 and the image pickup element unit 20. For this reason, since it is possible to reduce the cost of the manufacturing device 200, it is possible to manufacture the image pickup module 100 at a low cost.

Second Modification

In the above-mentioned embodiment, it is possible to perform highly accurate alignment by driving the second lens drive unit and the third lens drive unit that are included in the lens unit 10. In order to further improve accuracy, the image of the measurement chart 89 may be picked up at each measurement position by the image pickup element 27 while current is also applied to the hall element included in the lens drive device 16.

That is, the probe unit 113 of the manufacturing device 200 is provided with probes that come into contact with four terminals 14a to 14d connected to the x-direction hall element 16B and probes that come into contact with four terminals 14e to 14h connected to the y-direction hall element 16D.

Figure 9:
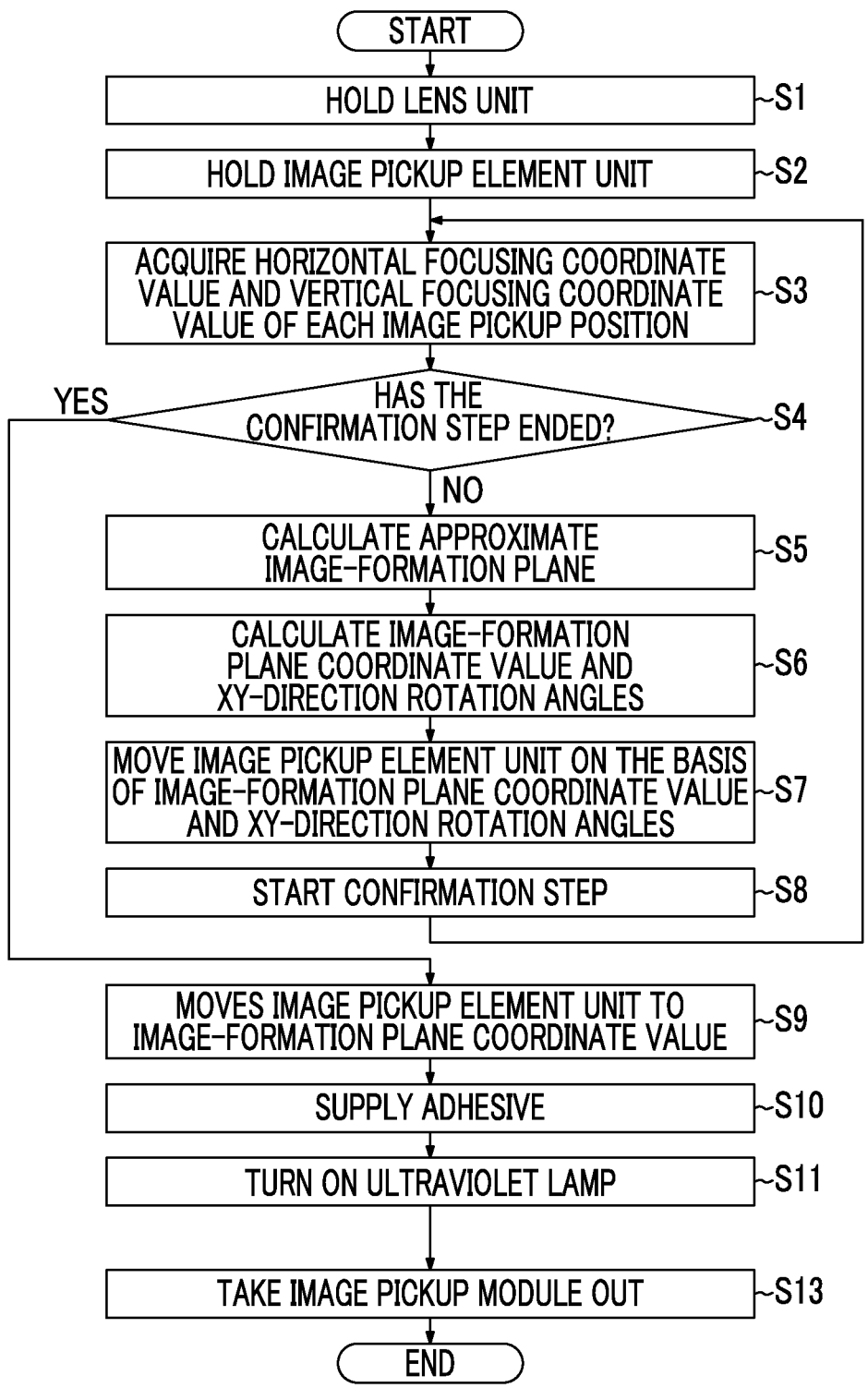
FIG. 9 is a flowchart illustrating steps of manufacturing the image pickup module by the image pickup module manufacturing device 200.

Then, in the step S3 of FIG. 9, an image may be picked up at each measurement position while current is also applied to the terminals 14a to 14d, the x-direction position of the lens group 12 is held with high accuracy by using a detection signal of the x-direction hall element 16B, current is also applied to the terminals 14e to 14h, and the y-direction position of the lens group 12 is held with high accuracy by using a detection signal of the y-direction hall element 16D.

Third Modification

An aspect, in which current is applied to terminals to which current is to be applied at the time of actual use to adjust the position of the lens group 12 when the alignment of the lens unit 10 and the image pickup element unit 20 is performed using the manufacturing device 200 of FIG. 5, has been described. The invention is not limited thereto, and for example, the lens unit 10 may be provided with a dedicated terminal to which current is to be applied when alignment is performed. In this case, the step S3 of FIG. 9 may be performed while current is applied to this dedicated terminal from the probe unit 113 to control the lens group 12 so that the lens group 12 is present at a desired position.

It is possible to improve the degree of freedom in the design of the probe unit 113 by using the dedicated terminal in this way.

Fourth Modification

An aspect in which the measurement position is changed by moving the image pickup element unit 20 while the Z-axis direction position of the lens unit 10 is fixed and a focusing coordinate value is acquired at each measurement position, has been described in the step S3 of FIG. 9. Instead of this aspect, the lens unit 10 may be provided so as to be movable in the Z-axis direction; the measurement position may be changed by moving the lens unit 10 in the Z-axis direction or moving each of the lens unit 10 and the image pickup element unit 20 in the Z-axis direction while the Z-axis direction position of the image pickup element unit 20 is fixed; and a focusing coordinate value may be acquired at each measurement position.

Further, the measurement position may be changed by moving the measurement chart 89 in the Z-axis direction while the Z-axis direction positions of the lens unit 10 and the image pickup element unit 20 are fixed; and a focusing coordinate value at each measurement position may be acquired. Furthermore, the measurement position may be changed by changing the Z-axis direction position of each of the lens unit 10, the image pickup element unit 20, and the measurement chart 89, and a focusing coordinate value at each measurement position may be acquired.

That is, the measurement position may be changed by changing the relative positions of the lens unit 10, the image pickup element unit 20, and the measurement chart 89 in the Z-axis direction; and the image of the measurement chart 89 may be picked up at each relative position by the image pickup element 27 to acquire a focusing coordinate value.

Furthermore, an aspect, in which a plurality of measurement positions are realized by changing the relative positions and the image of the measurement chart is picked up at each measurement position, has been described with reference to FIG. 9. Instead of this aspect, the image of the measurement chart may be continuously picked up (that is, a moving image may be taken), and the relative position may be changed to each measurement position while the image is picked up.

Moreover, an aspect, in which the Z-axis direction position of the image pickup element unit 20 relative to the lens unit 10 is adjusted by moving the image pickup element unit 20 while the Z-axis direction position of the lens unit 10 is fixed, has been described in the step S7 of FIG. 9. Instead of this aspect, the lens unit 10 may be provided so as to be movable in the Z-axis direction and the position may be adjusted by moving the lens unit 10 or moving each of the lens unit 10 and the image pickup element unit 20 while the position of the image pickup element unit 20 is fixed.

Further, not only the Z-axis direction position of the image pickup element unit 20 relative to the lens unit 10 but also the tilt of the image pickup element unit 20 relative to the lens unit 10 has been adjusted in the step S7 of FIG. 9, but the adjustment of the tilt may be omitted. For example, when the number of pixels of the image pickup element 27 is small, the quality of the image, which is picked up, can be maintained even though the adjustment of the tilt is not performed.

In the manufacturing device for performing a step of adjusting at least the Z-axis direction position of the image pickup element unit 20 relative to the lens unit 10 in this way, it is possible to perform highly accurate alignment by applying current to the second lens drive unit and the third lens drive unit of the lens unit 10 as described above.

Meanwhile, when only the Z-axis direction position of the image pickup element unit 20 relative to the lens unit 10 is to be adjusted in the step S7 of FIG. 9, at least one chart image only has to be provided on the chart surface of the measurement chart 89.

Further, when the Z-axis direction position and the tilt of the image pickup element unit 20 relative to the lens unit 10 are to be adjusted in the step S7 of FIG. 9, at least three chart images only have to be provided on the chart surface of the measurement chart 89.

When four or more chart images are used as described above, the tilt of the image pickup element unit 20 relative to the lens unit 10 can be adjusted with higher accuracy.

The following will be disclosed in this specification as described above.

There is disclosed a manufacturing method for an image pickup module that includes a lens unit including a lens group and an image pickup element unit fixed to the lens unit and including an image pickup element for picking up an image of a subject through the lens group. The lens unit includes a first lens drive unit that moves at least a part of lenses of the lens group in a first direction extending along an optical axis of the lens group and second and third lens drive units that move at least a part of lenses of the lens group in second and third directions, which are orthogonal to the optical axis of the lens group, respectively. The image pickup element unit includes an electrical connection portion that is electrically connected to the image pickup element. The image pickup module manufacturing method includes: a first step of holding the lens unit on an axis orthogonal to a measurement chart so that the second and third directions are perpendicular to the direction of gravity, and holding the image pickup element unit on the axis; a second step of changing relative positions of the lens unit and the image pickup element unit, which are held on the axis, and the measurement chart in a direction of the axis, and driving the image pickup element through the electrical connection portion to pick up an image of the measurement chart at each relative position by the image pickup element; and a third step of adjusting at least the relative positions of the lens unit and the image pickup element unit in the direction of the axis on the basis of image pickup signals, which are obtained when the image of the measurement chart is picked up by the image pickup element, and fixing the image pickup element unit to the lens unit.

In the second step, the image of the measurement chart may be picked up at each relative position by the image pickup element while current is applied to the second and third lens drive units of the held lens unit.

A lens unit, of which the position in a direction of the optical axis of the lens group driven by the first lens drive unit corresponds to an end of infinity or the closest end when the lens unit is held without applying current to the first lens drive unit while the second and third directions are perpendicular to the direction of gravity, may be prepared as the lens unit.

In the third step, the tilt of the image pickup element unit relative to the lens unit and the relative positions of the lens unit and the image pickup element in the direction of the axis may be adjusted on the basis of the image pickup signals.

A pixel pitch of the image pickup element may be 1.0 μm or less.

There is disclosed a manufacturing device for an image pickup module that includes a lens unit including a lens group and an image pickup element unit fixed to the lens unit and including an image pickup element for picking up an image of a subject through the lens group. The lens unit includes a first lens drive unit that moves at least a part of lenses of the lens group in a direction extending along an optical axis of the lens group and second and third lens drive units that move at least a part of lenses of the lens group in second and third directions, which are orthogonal to the optical axis of the lens group, respectively. The image pickup element unit includes an electrical connection portion that is electrically connected to the image pickup element. The image pickup module manufacturing device includes: a measurement chart; an image pickup element unit holder that holds the image pickup element unit on an axis orthogonal to the measurement chart; a lens unit holder that is disposed between the measurement chart and the image pickup element unit holder on the axis and holds the lens unit so that the second and third directions are perpendicular to the direction of gravity; a control unit that changes relative positions of the lens unit holder, the image pickup element unit holder, and the measurement chart in a direction of the axis, and drives the image pickup element through the electrical connection portion of the image pickup element unit to allow the image pickup element to pick up an image of the measurement chart at each relative position; an adjustment unit that adjusts at least the relative positions of the lens unit and the image pickup element unit in the direction of the axis on the basis of image pickup signals that are obtained when the image of the measurement chart is picked up by the image pickup element; and a unit fixing section that fixes the image pickup element unit and the lens unit of which at least the relative positions in the direction of the axis have been adjusted by the adjustment unit.

The disclosed image pickup module manufacturing device may further include a current application unit that applies current to the second and third lens drive units of the lens unit, and the control unit may allow the image pickup element to pick up the image of the measurement chart at each relative position while current is applied to the second and third lens drive units by the current application unit.

The adjustment unit may adjust a tilt of the image pickup element unit relative to the lens unit and the relative positions and the tilts of the lens unit and the image pickup element unit in the direction of the axis on the basis of the image pickup signals.

INDUSTRIAL APPLICABILITY

The image pickup module manufacturing method of the invention is effectively applied to the manufacture of image pickup modules that are mounted on, particularly, electronic devices, such as a mobile phone, a spectacle type electronic device, and a watch type electronic device.

EXPLANATION OF REFERENCES

100: image pickup module
10: lens unit
11: housing
12: lens group
13: flexible board
14A to 14F: lens unit-terminal portion
16: lens drive device
16A: x-direction VCM
16B: x-direction hall element
16C: y-direction VCM
16D: y-direction hall element
16E: z-direction VCM
16F: z-direction hall element
20: image pickup element unit
21: board
22: flexible board
23: external connection-terminal portion
24A to 24F: image pickup element unit-terminal portion
27: image pickup element
200: image pickup module manufacturing device
Ax: optical axis
z: direction extending along optical axis
x: direction orthogonal to z direction
y: direction orthogonal to z direction

What is claimed is:

1. A method of manufacturing an image pickup module including a lens unit that includes a lens group and an image pickup element unit that is fixed to the lens unit and includes an image pickup element for picking up an image of a subject through the lens group,
wherein the lens unit includes a first lens drive unit that moves at least a part of lenses of the lens group in a first direction extending along an optical axis of the lens group and second and third lens drive units that move at least a part of lenses of the lens group in second and third directions, which are orthogonal to the optical axis of the lens group, respectively,
the image pickup element unit includes an electrical connection portion that is electrically connected to the image pickup element,
the method comprises:
a first step of moving at least a part of lenses of the lens group in second and third directions which are orthogonal to the optical axis of the lens group, respectively, by the second and third lens drive units, and holding the lens unit on an axis orthogonal to a measurement chart so that the second and third directions are perpendicular to the direction of gravity, and holding the image pickup element unit on the axis;
a second step of changing relative positions of the lens unit and the image pickup element unit, which are held on the axis, and the measurement chart in a direction of the axis, and driving the image pickup element through the electrical connection portion to pick up an image of the measurement chart at each relative position by the image pickup element; and
a third step of adjusting at least the relative positions of the lens unit and the image pickup element unit in the direction of the axis on the basis of image pickup signals, which are obtained in the case where the image of the measurement chart is picked up by the image pickup element, and fixing the image pickup element unit to the lens unit.

2. The method according to claim 1,
wherein in the second step, the image of the measurement chart is picked up at each relative position by the image pickup element while current is applied to the second and third lens drive units of the held lens unit.

3. The method according to claim 1,
wherein a lens unit, of which the position in a direction of an optical axis of the lens group driven by the first lens drive unit corresponds to an end of infinity or the closest end in the case where the lens unit is held without applying current to the first lens drive unit while the second and third directions are perpendicular to the direction of gravity, is prepared as the lens unit.

4. The method according to claim 2,
wherein a lens unit, of which the position in a direction of an optical axis of the lens group driven by the first lens drive unit corresponds to an end of infinity or the closest end in the case where the lens unit is held without applying current to the first lens drive unit while the second and third directions are perpendicular to the direction of gravity, is prepared as the lens unit.

5. The method according to claim 1,
wherein in the third step, the tilt of the image pickup element unit relative to the lens unit and the relative positions of the lens unit and the image pickup element in the direction of the axis are adjusted on the basis of the image pickup signals.

6. The method according to claim 2,
wherein in the third step, the tilt of the image pickup element unit relative to the lens unit and the relative positions of the lens unit and the image pickup element in the direction of the axis are adjusted on the basis of the image pickup signals.

7. The method according to claim 3,
wherein in the third step, the tilt of the image pickup element unit relative to the lens unit and the relative positions of the lens unit and the image pickup element in the direction of the axis are adjusted on the basis of the image pickup signals.

8. The method according to claim 4,
wherein in the third step, the tilt of the image pickup element unit relative to the lens unit and the relative positions of the lens unit and the image pickup element in the direction of the axis are adjusted on the basis of the image pickup signals.

9. The method according to claim 1,
wherein a pixel pitch of the image pickup element is 1.0 µm or less.

10. The method according to claim 2,
wherein a pixel pitch of the image pickup element is 1.0 µm or less.

11. The method according to claim 3,
wherein a pixel pitch of the image pickup element is 1.0 µm or less.

12. The method according to claim 4,
wherein a pixel pitch of the image pickup element is 1.0 µm or less.

13. The method according to claim 5,
wherein a pixel pitch of the image pickup element is 1.0 µm or less.

14. The method according to claim 6,
wherein a pixel pitch of the image pickup element is 1.0 µm or less.

15. The method according to claim 7,
wherein a pixel pitch of the image pickup element is 1.0 µm or less.

16. The method according to claim 8,
wherein a pixel pitch of the image pickup element is 1.0 µm or less.

17. A device for manufacturing an image pickup module including a lens unit that includes a lens group and an image pickup element unit that is fixed to the lens unit and includes an image pickup element for picking up an image of a subject through the lens group,
wherein the lens unit includes a first lens drive unit that moves at least a part of lenses of the lens group in a direction extending along an optical axis of the lens group and second and third lens drive units that move at least a part of lenses of the lens group in second and third directions, which are orthogonal to the optical axis of the lens group, respectively,
the image pickup element unit includes an electrical connection portion that is electrically connected to the image pickup element,
the device comprises:
a measurement chart;
an image pickup element unit holder that holds the image pickup element unit on an axis orthogonal to the measurement chart;
a lens unit holder that is disposed between the measurement chart and the image pickup element unit holder on the axis and holds the lens unit so that the second and third directions are perpendicular to the direction of gravity by moving at least a part of lenses of the lens group in second and third directions which are orthogonal to the optical axis of the lens group, respectively, by the second and third lens drive units;
a control unit that changes relative positions of the lens unit holder, the image pickup element unit holder, and the measurement chart in a direction of the axis, and drives the image pickup element through the electrical connection portion of the image pickup element unit to allow the image pickup element to pick up an image of the measurement chart at each relative position;
an adjustment unit that adjusts at least the relative positions of the lens unit and the image pickup element unit in the direction of the axis on the basis of image pickup signals that are obtained in the case where the image of the measurement chart is picked up by the image pickup element; and
a unit fixing section that fixes the image pickup element unit and the lens unit of which at least the relative positions in the direction of the axis have been adjusted by the adjustment unit.

18. The device according to claim 17, further comprising:
a current application unit that applies current to the second and third lens drive units of the lens unit,
wherein the control unit allows the image pickup element to pick up the image of the measurement chart at each relative position while current is applied to the second and third lens drive units by the current application unit.

19. The device according to claim 17,
wherein the adjustment unit adjusts a tilt of the image pickup element unit relative to the lens unit and the relative positions of the lens unit and the image pickup element unit in the direction of the axis on the basis of the image pickup signals.

* * * * *